US010451314B2

(12) United States Patent
Markiewicz et al.

(10) Patent No.: US 10,451,314 B2
(45) Date of Patent: Oct. 22, 2019

(54) SOLAR PANEL CLAMP

(71) Applicant: Preformed Line Products, Mayfield Village, OH (US)

(72) Inventors: John B. Markiewicz, Mentor, OH (US); Darius J. Kaunas, Medina, OH (US)

(73) Assignee: Preformed Line Products, Mayfield Village, OH (US)

( * ) Notice: Subject to any disclaimer, the term of this patent is extended or adjusted under 35 U.S.C. 154(b) by 134 days.

(21) Appl. No.: 14/530,811

(22) Filed: Nov. 2, 2014

(65) Prior Publication Data
US 2015/0052712 A1 Feb. 26, 2015

Related U.S. Application Data

(63) Continuation-in-part of application No. 13/368,651, filed on Feb. 8, 2012, now abandoned, which is a
(Continued)

(51) Int. Cl.
*F24S 25/636* (2018.01)
*H02S 20/23* (2014.01)
(Continued)

(52) U.S. Cl.
CPC .......... *F24S 25/636* (2018.05); *F16B 5/0072* (2013.01); *F16B 7/187* (2013.01); *F16B 43/025* (2013.01);
(Continued)

(58) Field of Classification Search
CPC ........ F16B 37/046; F16B 2/065; F16B 34/06; F16B 21/02; F16B 5/10; F16B 37/045;
(Continued)

(56) References Cited

U.S. PATENT DOCUMENTS 7,435,134 B2 * 10/2008 Lenox .................... F24J 2/5245
439/567
7,758,011 B2 * 7/2010 Haddock ............. E04F 13/0821
248/500
(Continued)

FOREIGN PATENT DOCUMENTS

FR 2960608 A1 * 12/2011 .............. F24S 25/61
JP 10121640 A * 5/1998 .............. F24S 25/35

*Primary Examiner* — Jonathan Liu
*Assistant Examiner* — Taylor L Morris
(74) *Attorney, Agent, or Firm* — Cooper Legal Group, LLC

(57) ABSTRACT

A clamping apparatus secures a photovoltaic module to a rail. The clamping apparatus includes a bolt extending between a first end and a second end of the bolt. The clamping apparatus includes a clamp defining a bolt opening into which the bolt is received and a support structure. The support structure positions the clamp at a first location on the bolt. The first location is a first distance from a top rail surface plane within which a top surface of the rail lies. The support structure is adjustable to position the clamp at a second location on the bolt. The second location is a second distance from the top rail surface plane. The first distance is different than the second distance. The support structure has a support structure thickness corresponding to a third distance that is less than the first distance and less than the second distance.

19 Claims, 12 Drawing Sheets

Related U.S. Application Data continuation-in-part of application No. PCT/US2012/024247, filed on Feb. 8, 2012.

(51) Int. Cl.

| | | |
|---|---|---|
| H02S 20/00 | (2014.01) | |
| H02S 20/30 | (2014.01) | |
| F24S 25/33 | (2018.01) | |
| F16B 43/02 | (2006.01) | |
| F16B 5/00 | (2006.01) | |
| F16B 7/18 | (2006.01) | |
| H01L 31/02 | (2006.01) | |
| H02S 20/24 | (2014.01) | |
| F24S 25/61 | (2018.01) | |
| F16B 37/04 | (2006.01) | |
| F24S 25/00 | (2018.01) | |

(52) U.S. Cl.
CPC .............. F24S 25/33 (2018.05); H01L 31/02 (2013.01); H02S 20/00 (2013.01); H02S 20/23 (2014.12); H02S 20/30 (2014.12); F16B 37/045 (2013.01); F24S 25/61 (2018.05); F24S 2025/807 (2018.05); H02S 20/24 (2014.12); Y02B 10/12 (2013.01); Y02E 10/47 (2013.01); Y10T 24/44974 (2015.01); Y10T 29/49959 (2015.01); Y10T 29/49963 (2015.01)

(58) Field of Classification Search
CPC .............. F24J 2/5232; F24J 2002/5284; F24J 2002/5288; F24J 2002/5294; F24J 2002/5298; F24J 2/5258; F24J 2/5205; F24J 2/5245; G09F 7/18; Y02E 10/47; Y02E 10/50; Y10S 24/53; Y10S 24/56; H02S 20/00; H02S 20/23; H02S 20/24; H02S 20/30; H02S 30/10; B60P 7/0815; B60P 7/0807; Y02B 10/12; F24S 25/636; F24S 25/61; F24S 25/33
USPC ........... 248/500, 228.1, 231.21; 411/84, 349, 411/549, 551
See application file for complete search history.

(56) References Cited

U.S. PATENT DOCUMENTS

| | | | | |
|---|---|---|---|---|
| 8,495,839 B2* | 7/2013 | Tsuzuki | ................. | F24J 2/4614 136/244 |
| 8,505,864 B1* | 8/2013 | Taylor | ................... | F24S 25/636 248/237 |
| 9,647,433 B2* | 5/2017 | Meine | .................... | F24S 25/61 |
| 9,876,463 B2* | 1/2018 | Jasmin | .................... | H02S 20/23 |
| 10,277,162 B1* | 4/2019 | Atia | ........................ | H02S 20/23 |
| 2004/0165947 A1* | 8/2004 | Herb | ..................... | F16B 37/046 403/374.3 |
| 2006/0086382 A1* | 4/2006 | Plaisted | ................ | F24S 25/636 136/244 |
| 2008/0179488 A1* | 7/2008 | Tsuge | ..................... | F16F 15/08 248/638 |
| 2008/0250614 A1* | 10/2008 | Zante | .................... | F16B 5/0657 24/542 |
| 2009/0134291 A1* | 5/2009 | Meier | .................... | F24J 2/5233 248/222.14 |
| 2009/0282755 A1* | 11/2009 | Abbott | .................... | F16B 2/185 52/173.3 |
| 2010/0276558 A1* | 11/2010 | Faust | ..................... | F24J 2/5205 248/222.14 |
| 2010/0307074 A1* | 12/2010 | Stearns | .................. | E04D 13/10 52/173.1 |
| 2011/0039430 A1* | 2/2011 | Aftanas | ................. | F24J 2/5258 439/92 |
| 2011/0085875 A1* | 4/2011 | Aftanas | ................. | F16B 7/187 411/347 |
| 2011/0100434 A1* | 5/2011 | Van Walraven | ....... | F24J 2/5205 136/251 |
| 2011/0138585 A1* | 6/2011 | Kmita | .................... | F24J 2/5258 24/522 |
| 2011/0179606 A1* | 7/2011 | Magno, Jr. | ........... | F24S 25/636 24/457 |
| 2011/0214365 A1* | 9/2011 | Aftanas | ................. | F24J 2/5258 52/173.3 |
| 2011/0299957 A1* | 12/2011 | Young | ................... | F24J 2/5205 411/401 |
| 2012/0167364 A1* | 7/2012 | Koch | ........................ | F16B 2/12 29/281.1 |
| 2012/0275066 A1* | 11/2012 | O'Brien | ................ | F24J 2/5237 361/1 |
| 2013/0187014 A1* | 7/2013 | James | ..................... | F16L 3/123 248/73 |
| 2013/0294814 A1* | 11/2013 | Sader | ..................... | F24J 2/5205 403/21 |
| 2015/0184896 A1* | 7/2015 | Lippert | .................... | H02S 20/00 211/41.1 |
| 2016/0204732 A1* | 7/2016 | Thomas | .................. | F24S 40/80 248/201 |

* cited by examiner

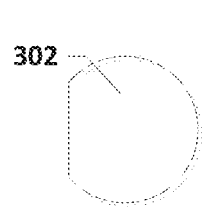
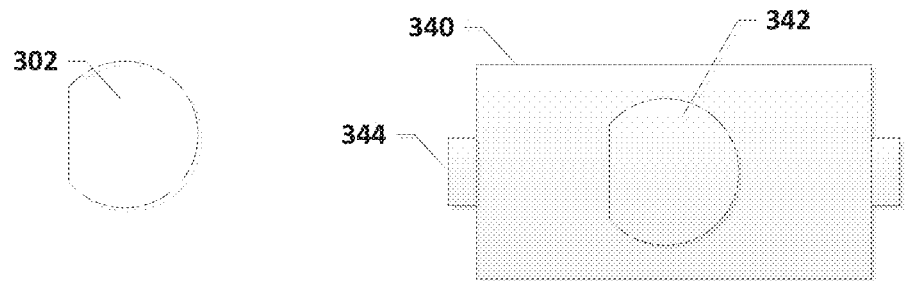
FIG. 4  FIG. 5
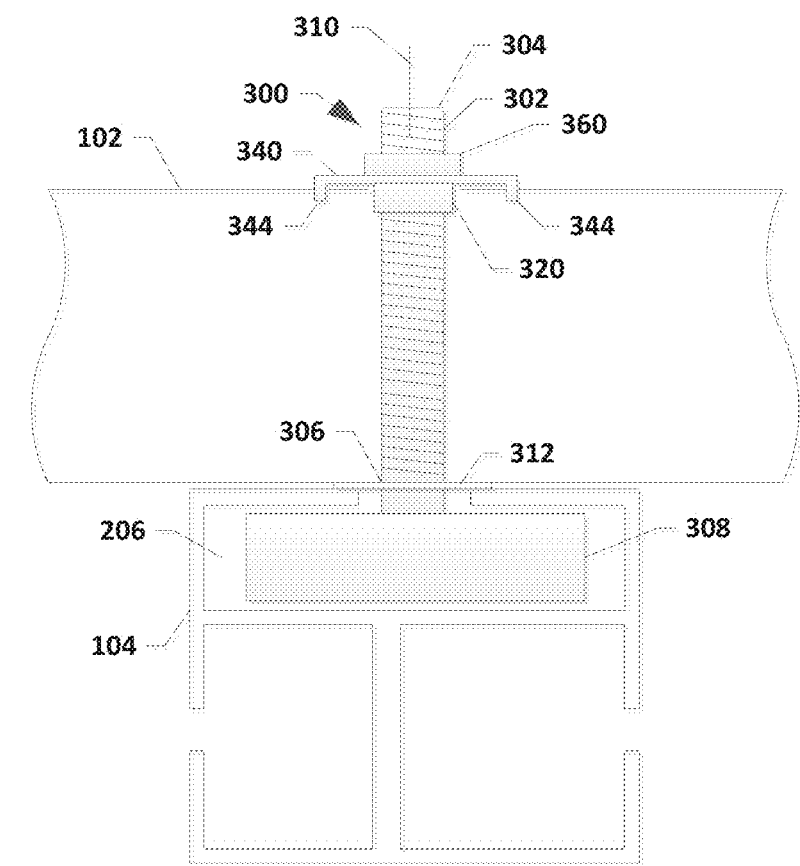
FIG. 6

SOLAR PANEL CLAMP

CROSS-REFERENCE TO RELATED APPLICATIONS

This application is a continuation-in-part of U.S. patent application Ser. No. 13/368,651, filed Feb. 8, 2012, titled "Solar Panel Clamp," which is herein incorporated by reference in its entirety. This application is a continuation-in-part of International Application No. PCT/US2012/024247, filed Feb. 8, 2012, titled "Solar Panel Clamp," which is herein incorporated by reference in its entirety.

BACKGROUND

The present application relates to, among other things, systems and/or methods for clamping photovoltaic (PV) modules to a rail and/or rail system configured to support the photovoltaic modules (e.g., to form a PV array).

Solar power often refers to the conversion of energy from sunlight to electricity (e.g., to power an appliance, car, home, business, etc.). Solar power generation has become increasingly popular given a shift away from producing electricity via fossil fuels (e.g., coal, oil, natural gas, etc.). Such an increase in popularity may be attributed to numerous factors. For example, the production of electricity via sunlight is considered to be more environmentally friendly than using fossil fuels (e.g., few to no pollutants are emitted using solar technology). Moreover, the conversion efficiency (e.g., amount of sunlight converted into electricity) has continued to increase while the cost to manufacture photovoltaic modules (e.g., solar panels) has decreased, allowing for more widespread applicability (e.g., both in terms of geographic location and affordability).

To convert sunlight or other light into electricity, one or more photovoltaic modules, comprised of a plurality of photovoltaic cells, may be used. Respective photovoltaic cells are configured to convert light energy (e.g., from the sun) into electricity via the photovoltaic effect (e.g., where a voltage and/or electric current is created in a material based upon exposure to light). Because the power that one module can produce is usually insufficient to meet a desired power output (e.g., to power a home and/or business), a plurality of photovoltaic modules may be operably coupled together and arranged to form a photovoltaic array. Traditionally, the photovoltaic modules have been arranged in a grid of rows or columns. However, in some applications, they may be arranged in a different pattern.

To secure the photovoltaic modules, a traditional rail and top-down clamping apparatus have been employed. The rails often comprise a channel and the clamping apparatus comprises a t-shaped bolt (e.g., also referred to as a "t-bolt") that is designed to fit into the channel of the rail. In operation, the t-bolt is usually inserted into the channel and turned to a desired orientation relative the channel. A clamp of the clamping apparatus is then attached to the t-bolt and secured via a nut to mitigate movement of the module relative to the rail.

Typically, components of the clamping apparatus (e.g., the t-bolt, clamp, and nut) are shipped individually to the installation site and assembled once the modules have been set in place. That is, the module is set in place, the t-bolt is inserted into the channel, the clamp is attached to the bolt, the nut is attached to the bolt, and then the nut is tightened to secure the module (e.g., via the clamp). Given that a typical photovoltaic array comprises at least 12 modules, and may exceed 100 modules, and given that a plurality of clamping apparatuses may be used to secure respective modules, the installation process may be labor intensive (e.g., adding to the total cost of the photovoltaic array). Moreover, given that clamping apparatuses are assembled on site, bolts, clamps and/or nuts may be lost, dropped, etc. during the installation process, further increasing installation time and/or cost.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an example, a clamping apparatus is configured to secure one or more photovoltaic modules to a rail. The clamping apparatus comprises a bolt extending along a bolt axis between a first end of the bolt and a second end of the bolt. The second end of the bolt is configured to be received within the rail. The clamping apparatus comprises a clamp defining a bolt opening into which the bolt is received. The clamping apparatus comprises a support structure configured to position the clamp at a first location on the bolt when the second end of the bolt is received within the rail and the clamp does not secure the one or more photovoltaic modules to the rail. The first location is a first distance from a top rail surface plane within which a top surface of the rail lies where the first distance extends along a first distance axis that is parallel to the bolt axis and is measured from the top rail surface plane to a bottom surface of the clamp. The clamp is disposed to a first side of the top rail surface plane when the clamp is positioned at the first location and the second end of the bolt is disposed to a second side of the top rail surface plane when the second end of the bolt is received within the rail. The support structure is configured to position the clamp at a second location on the bolt when the second end of the bolt is received within the rail and the clamp does secure the one or more photovoltaic modules to the rail. The second location is a second distance from the top rail surface plane where the second distance extends along a second distance axis that is parallel to the bolt axis and is measured from the top rail surface plane to the bottom surface of the clamp. The clamp is disposed to the first side of the top rail surface plane when the clamp is positioned at the second location. The first distance is different than the second distance. The support structure has a support structure thickness corresponding to a third distance measured from a first end of the support structure to a second end of the support structure. The third distance extends along a support structure axis that is parallel to the bolt axis and is less than the first distance and less than the second distance.

In another example, a clamping apparatus is configured to secure one or more photovoltaic modules to a rail. The clamping apparatus comprises a bolt extending along a bolt axis between a first end of the bolt and a second end of the bolt. The second end of the bolt is configured to be received within the rail. The clamping apparatus comprises a clamp defining a bolt opening into which the bolt is received. The clamping apparatus comprises a support structure configured to position the clamp at a first location on the bolt when the second end of the bolt is received within the rail and the clamp does not secure the one or more photovoltaic modules to the rail. The first location is a first distance from a top rail surface plane within which a top surface of the rail lies where the first distance extends along a first distance axis that is parallel to the bolt axis and is measured from the top rail surface plane to a bottom surface of the clamp. The clamp is disposed to a first side of the top rail surface plane when the clamp is positioned at the first location and the second end of the bolt is disposed to a second side of the top rail surface plane when the second end of the bolt is received within the rail. The support structure is configured to position the clamp at a second location on the bolt when the second end of the bolt is received within the rail and the clamp does secure the one or more photovoltaic modules to the rail. The second location is a second distance from the top rail surface plane where the second distance extends along a second distance axis that is parallel to the bolt axis and is measured from the top rail surface plane to the bottom surface of the clamp. The clamp is disposed to the first side of the top rail surface plane when the clamp is positioned at the second location. The first distance is different than the second distance. The support structure comprises a first affixation that affixes the clamp to a nut configured to be threaded onto the bolt when the second end of the bolt is received within the rail and the clamp does not secure the one or more photovoltaic modules to the rail. The support structure has a support structure thickness corresponding to a third distance measured from a first end of the support structure to a second end of the support structure. The third distance extends along a support structure axis that is parallel to the bolt axis and is less than the first distance and less than the second distance.

In yet another example, a clamping apparatus configured to secure one or more photovoltaic modules to a rail. The clamping apparatus comprises a bolt extending along a bolt axis between a first end of the bolt and a second end of the bolt. The second end of the bolt is configured to be received within the rail. The clamping apparatus comprises a clamp defining a bolt opening into which the bolt is received. The clamping apparatus comprises a support structure configured to position the clamp at a first location on the bolt when the second end of the bolt is received within the rail and the clamp does not secure the one or more photovoltaic modules to the rail. The first location is a first distance from a top rail surface plane within which a top surface of the rail lies where the first distance extends along a first distance axis that is parallel to the bolt axis and is measured from the top rail surface plane to a bottom surface of the clamp. The clamp is disposed to a first side of the top rail surface plane when the clamp is positioned at the first location and the second end of the bolt is disposed to a second side of the top rail surface plane when the second end of the bolt is received within the rail. The support structure is configured to position the clamp at a second location on the bolt when the second end of the bolt is received within the rail and the clamp does secure the one or more photovoltaic modules to the rail. The second location is a second distance from the top rail surface plane where the second distance extends along a second distance axis that is parallel to the bolt axis and is measured from the top rail surface plane to the bottom surface of the clamp. The clamp is disposed to the first side of the top rail surface plane when the clamp is positioned at the second location, the first distance different than the second distance. The support structure has a support structure thickness corresponding to a third distance measured from a first end of the support structure to a second end of the support structure. The third distance extends along a support structure axis that is parallel to the bolt axis and is less than the first distance and less than the second distance. The third distance is less than about ½ of the second distance.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

FIGURES

The application is illustrated by way of example and not limitation in the figures of the accompanying drawings, in which like references generally indicate similar elements and in which:

FIG. 4 illustrates a top-down view of an example bolt of an example clamping apparatus.

FIG. 5 illustrates a top-down view of an example clamp of an example clamping apparatus.

FIG. 6 illustrates a cross-sectional view of an example photovoltaic array with a clamping apparatus attached thereto.

DESCRIPTION

Figure 1:
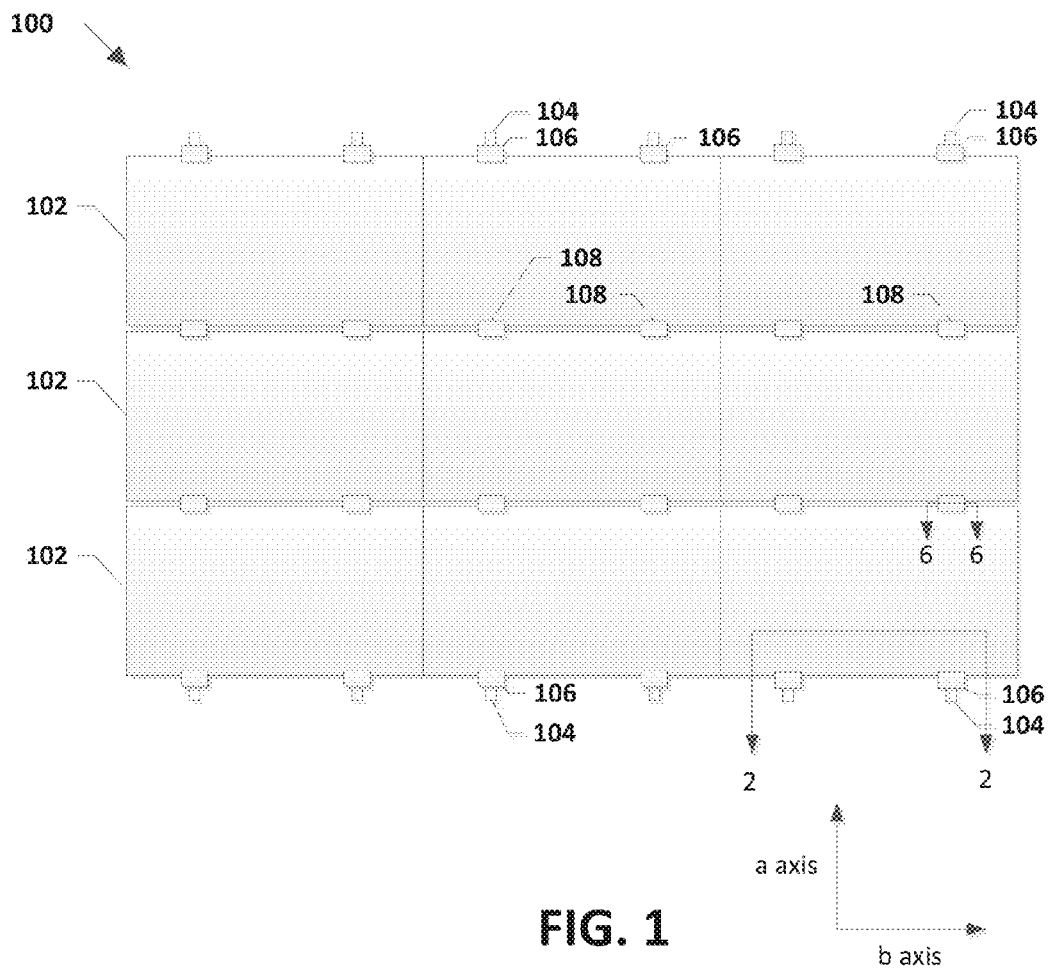
FIG. 1 illustrates an example of a photovoltaic array.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are illustrated in block diagram form in order to facilitate describing subject matter.

FIG. 1 illustrates an example photovoltaic array 100 (e.g., also referred to as a solar panel array, solar array, and/or the like) comprised of a plurality of photovoltaic modules 102 that are arranged along and/or attached to one or more rails 104 (e.g., substantially occluded by the overlying modules 102). As illustrated herein, the rails 104 extend substantially parallel to the a-axis, although they may extend substantially parallel to the b-axis. Moreover, as will be described in further detail with respect to FIG. 2, respective rails further comprise a channel that runs along the length of the rails (e.g., in the example embodiment, channels run parallel to the a-axis).

Channels in the rails may be useful for securing the modules 102 to the rails 104 via one or more clamping apparatuses 106, 108. For example, in the illustrated embodiment, the modules 102 are secured to the rails 104 via end-clamp apparatuses 106 and mid-clamp apparatuses 108. Generally, the differences between end-clamp apparatuses 106 and mid-clamp apparatuses 108 are merely based upon the number of modules the clamping apparatus is intended to secure and/or the location of the clamping apparatus. For example, in the illustrated embodiment, end-clamp apparatuses 106 are positioned on an edge of the array 100 and are respectively configured to secure merely one module 102. Mid-clamp apparatuses 108 are positioned between modules 102 of the array 100 and are configured to secure two or more modules 102, for example. As used herein, the terms clamping apparatus, clamping apparatuses, and/or the like are intended to be interpreted in a broad sense to comprise both end-clamp apparatuses 106 and mid-clamp apparatuses 108.

While a specific rail type and/or structure configuration is shown in the examples described herein, it is to be understood that the clamping apparatus(es) described herein can be employed with alternative rail and/or attachments systems to the extent practical. Moreover, the number of modules comprised in the example array 100, the arrangement of the array 100, and/or the arrangement of the modules 102 relative to the rails 104 are not intended to limit the scope of the appended claims. Further, while specific reference is made to the applicability of the clamping apparatus for securing photovoltaic modules, it will be appreciated that the clamping apparatus(es) may find utility in other applications. Thus, to the extent practical, the instant disclosure, including the scope of the claims, is not intended to be limited to a clamping apparatus for securing photovoltaic modules.

Figure 2:
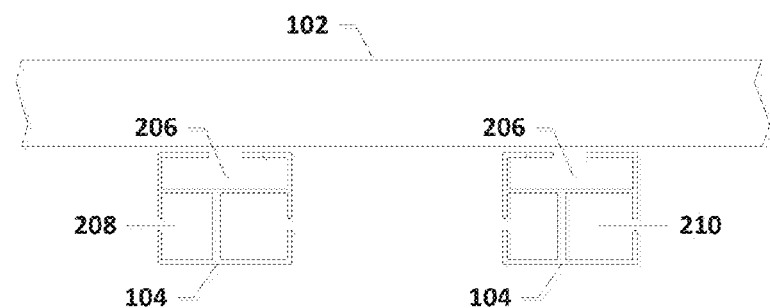
FIG. 2 illustrates a cross-sectional view of an example photovoltaic array comprising rails to which one or more photovoltaic modules can be attached.

FIG. 2 illustrates a cross-sectional view of a photovoltaic array 100 (e.g., taken along line 2-2 in FIG. 1). As illustrated, a photovoltaic module 102 is situated on top of one or more rails 104. The rails 104 are configured to accommodate a clamping apparatus (not shown) to secure the module 102 to the rail 104. For example, in the illustrated embodiment, respective rails 104 comprise a channel 206 through which a portion of the clamping apparatus (e.g., a t-shaped or other-shaped head of the clamping apparatus (e.g., or, more particularly, of a bolt portion of the clamping apparatus)) may be inserted. However, other mechanisms for securing the clamping apparatus to the rail are also contemplated. For example, in another embodiment, the rail comprises an extruded portion to which the clamping apparatus attaches.

It will be appreciated that one or more of the rails 104 may further comprise other channels 208, 210 that may be utilized to secure the rail to other rails and/or to secure the rail to a supporting structure (e.g., such as a roof or pole to which the photovoltaic array is attached), for example. Moreover, the shape of the rail, number and/or size of additional channels, etc. may depend upon, among other things, how the rails 104 are coupled together (e.g., if they are coupled together), a weight of the modules 102, a structure to which the rails 104 attach, etc.

Figure 3:
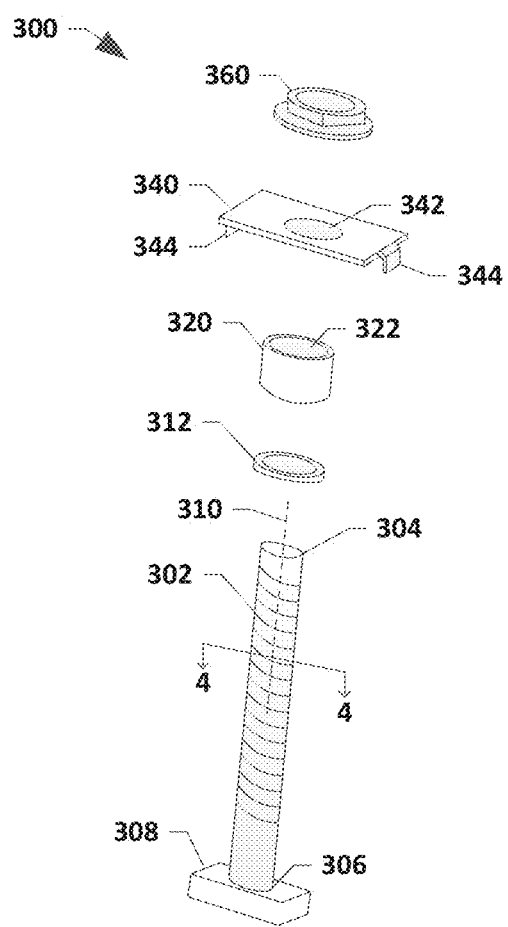
FIG. 3 illustrates an example clamping apparatus.

FIG. 3 illustrates an exploded view of a clamping apparatus 300 (e.g., 106, 108 in FIG. 1) that may be configured to secure one or more photovoltaic modules 102 to a rail(s) 104. It will be appreciated that FIG. 3 illustrates what is referred to above as a mid-clamp apparatus (e.g., based upon the size and/or shape of the clamp 340), although the features described herein may also be applicable to end-clamp apparatuses.

The clamping apparatus 300 comprises a threaded bolt 302, a grounding device 312, a support structure 320, a clamp 340, and a nut 360. It will be appreciated that at least some of these components may be optional and/or the clamping apparatus 300 may comprise additional components not described herein. For example, in one embodiment, the grounding device 312 (e.g., washer) may be optional.

The bolt 302 may comprise at least two ends (e.g., a first end 304 and a second end 306), where the second end 306 may be defined by a head 308 that is configured to be inserted into a channel of a rail, for example. The bolt 302 can extend along a bolt axis 310 between the first end 304 of the bolt 302 and the second end 306 of the bolt 302.

Typically, the head 308 has at least one dimension that is greater than a width of the channel, which reduces the possibility of the bolt 302 coming out of the channel once the head 308 is inserted into the channel and/or oriented as desired relative to the channel. By way of example, in the illustrated clamping apparatus 300, the bolt 302 comprises a T-shaped portion or T-shaped head 308. As will be further explained, such a bolt 302 is configured to (easily) slip into the channel of the rail when it is oriented in a first manner relative to the channel (e.g., when the more narrow dimension of the head 308 is perpendicular to the length of the channel) and to be secured in the channel when it is oriented in a second manner relative to the channel (e.g., when the more narrow dimension of the head 308 is parallel to the length of the channel). Alternatively, in another embodiment, the bolt 302 may not comprise a defined head 308. Rather, a nut and/or other component may be coupled to the bolt 302 to substantially form a head that has at least one dimension that is greater than a width of the channel, for example.

The example clamping apparatus 300 comprises a grounding device 312. The grounding device may be selectively coupled to a shaft of the bolt 302 and/or may be permanently affixed the bolt 302. For example, in an embodiment, the grounding device 312 may comprise a washer with smooth and/or jagged surfaces. By way of example, the washer may comprises one or more teeth that are configured to mitigate rotation of the washer relative to the rail and/or are configured to pierce into the rail (e.g., comprised of an anodized aluminum) to provide a gas tight connection between the washer and the rail, for example (e.g., mitigating oxidation). It will be appreciated that by coupling the rail to the grounding device 312 as described, the clamping apparatus 300 and/or the photovoltaic module to which it is affixed may be ground to the rail. In this way, a ground wire may not be run to respective clamping apparatuses and/or to respective photovoltaic modules, for example.

In another embodiment, the grounding device 312 may be configured to attach to a ground wire that is coupled to ground wires from other clamping apparatuses and/or coupled to an earthing electrode (e.g., metal rod), for example. Such a feature may reduce undesired contact with a voltage should electrical components of the array fail, reduce build-up of electricity, and/or provide a channel for conducting high currents associated with lightning strikes, for example. As such, the grounding device 312 can function to electrically ground the bolt 302.

It will be appreciated that the illustrated grounding device 312 (e.g., which has a shape similar to a washer) is merely one of numerous examples of grounding devices that may be utilized. In another embodiment, the grounding device 312 is a ground wire that is wrapped around, soldered, and/or otherwise attached to a portion of the clamping apparatus 300, for example. It will be appreciated that in some examples, the grounding device 312 is optional and may not be provided.

The clamping apparatus 300 further comprises the support structure 320 configured to be selectively coupled to the shaft of the bolt 302 and/or permanently affixed to the bolt 302. It will be appreciated that while the support structure is generally illustrated as having a concentric arrangement relative to the bolt 302, the instant disclosure, included the scope of the appended claims, is not intended to be so limited. That is, unless specified to the contrary, any configuration(s), design(s), etc. are contemplated for the support structure (e.g., that facilitate the functions provided herein). The support structure 320 is also configured to position the clamp 340 of the clamping apparatus 300 a specified distance from the second end 306 (e.g., head 308) of the bolt 302 and/or to position the clamp 340 a specified distance from (e.g., a top edge of) the rail once the clamping apparatus 300 is attached to the rail, for example.

The support structure 320 may be comprised of a compressible material and is configured to be compressed once the photovoltaic module is positioned appropriately relative to the rail to secure the module. That is, once the module is in the desired position, an installer, for example, may tighten the nut 360, causing the support structure 320 to be compressed and reducing the space between the rail and the clamp 340. Such compressible materials may comprise, but are not limited to, a spring (e.g., such as a rubber spring or metal spring), a gasket, a polystyrene, and/or a compressible metal structure (e.g., such as a soft metal). The support structure 320 defines a second bolt opening 322 into which the bolt 302 may be received.

The clamping apparatus 300 also comprises a clamp 340 configured to be selectively coupled to the shaft of the bolt 302 and/or permanently affixed to the bolt 302. The clamp 340 defines a bolt opening 342 into which the bolt 302 can be received. The clamp 340 can secure one or more photovoltaic modules to the rail. For example, the clamp 340 may comprise one or more edges that are configured to extend over a portion of the module(s). When the nut 360 is selectively coupled to the shaft via the first end 304 of the bolt 302 and tightened, the one or more edges extending over the portion of the module may apply pressure to the module, causing the module to be secured to the rail. In this way, the nut 360 acts to secure the clamp 340 and the support structure 320 to the bolt 302 and/or to apply pressure to the clamp 340 and/or the support structure 320 when tightened, for example.

The clamping apparatus 300 may also comprise other features that promote safely securing the one or more modules to the rail, for example. By way of example, in an embodiment, the clamp 340 comprises one or more tabs 344 that are configured to contact a side-edge of one or more modules (e.g., as opposed to a top edge facing the sunlight) and/or to be partially inserted between two or more modules. Such tabs 344 are configured to reduce and/or mitigate rotation of the clamp relative to the module while the nut 360 is being tightened, for example.

FIG. 4 illustrates a cross-sectional view (e.g., taken along line 4-4 in FIG. 3) of the bolt 302. FIG. 5 illustrates a top-down view of the clamp 340. In some examples, the shaft of the bolt 302 may comprise a non-cylindrical portion (e.g., such as a flat/shaved edge) and the clamp 340 may comprise a non-cylindrical bolt opening 342 (e.g., of a similar shape to the non-cylindrical portion of the shaft) into which the non-cylindrical portion of the shaft is inserted. Such non-cylindrical features of the bolt 302 and the clamp 340 and/or the tabs 344 of the clamp may mitigate rotation of the bolt 302, and the clamping apparatus 300 generally, relative to the rail once the bolt is inserted into the channel and turned appropriately (e.g., mitigating rotation of the bolt 302 as the nut 360 is being tightened). That is, stated differently, the one or more tabs 344, the non-cylindrically shaped bolt opening 342, and the non-cylindrically shaped portion of the bolt 302 may facilitate alignment of the second end 306 of the bolt 302 (e.g., the head 308) within a channel of the rail, such that rotation of the bolt 302 relative to the channel is mitigated as the one or more modules are being secured (e.g., as the nut 360 is being tightened).

It will be appreciated that these and other features may be described in more detail in U.S. Patent Publication 2011/0299957 and assigned to Preformed Line Products Company, at least some of which may be incorporated herein by reference. For example, another feature of the bolt 302 may be that one or more edges of the head 308 of the bolt 302 are rounded while other edges are substantially square to control how the bolt 302 can be rotated within the channel of the rail. For example, in one embodiment, the head 308 comprises one round corner and three square corners such that the bolt can be rotated in merely one direction relative to the rail when the t-shaped head of the bolt is inserted into a channel of the rail (e.g., because the square corners limit rotation in other directions). Moreover, once turned to a specified position (e.g., turned 90 degrees relative to an initial position when the bolt/clamping apparatus is inserted into the channel (e.g., such that the head is substantially perpendicular to the channel as described further in FIGS. 7-8), the head 308 with merely one round corner may mitigate further rotation of the bolt 302 (e.g., to mitigate rotating the bolt further such that the head 308 becomes parallel with the channel).

FIG. 6 illustrates a cross-sectional view (e.g., taken along line 6-6 in FIG. 1) illustrating a clamping apparatus 300 securing a photovoltaic module 102 to a rail 104 via a channel 206. The clamping apparatus 300 comprises a bolt 302 comprising a head 308 that is inserted into the channel 206 of the rail 104. The example clamping apparatus 300 also comprises a grounding device 312, support structure 320, clamp 340 including tabs 344 that abut the side of the module 102, and a nut 360.

Figure 7:
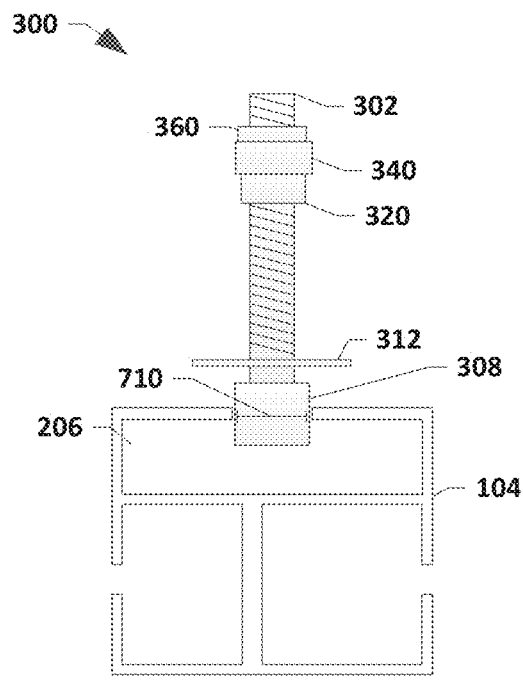
FIG. 7 illustrates a cross-sectional view of an example photovoltaic array with a clamping apparatus being inserted into a channel of a rail of the array.
Figure 8:
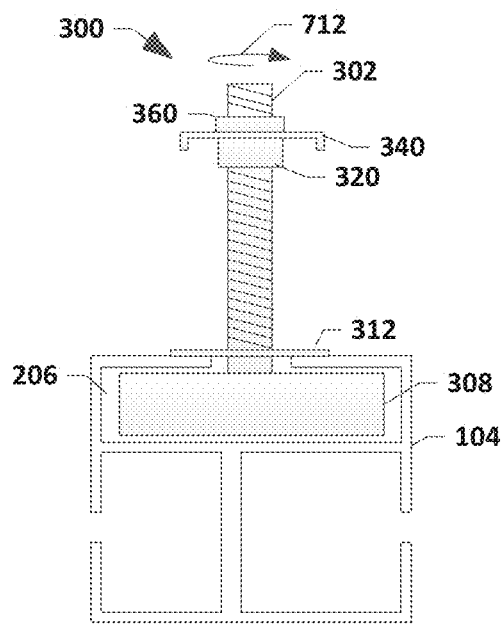
FIG. 8 illustrates a clamping apparatus being rotated to lock the clamping apparatus into a channel of a rail of a photovoltaic array.

FIGS. 7-8 illustrate how a preassembled clamping apparatus 300 comprising a bolt 302 having a t-shaped head 308 may be selectively coupled to a rail 104. More particularly, FIG. 7 illustrates a portion of the clamping apparatus 300 being inserted into a channel 206 of the rail 104. The t-shaped head 308 is turned such that a more narrow dimension 710 of the head 308 is perpendicular the length of the channel 206 (e.g., going into and out of the page), allowing the t-shaped head 308 to be lowered into the channel 206.

Once the t-shaped head 308 is positioned in the channel 206, the bolt 302 (e.g., and/or the entire clamping apparatus 300) may be rotated 712 clockwise and/or counter-clockwise (e.g., 90 degrees) until the narrow dimension of the head 308 is parallel or substantially parallel to the length of the channel 206 (e.g., such that the narrow dimension of the head 308 is going into and/or out of the page) as illustrated in FIG. 8. It will be appreciated that this changed orientation of the head 308 relative to the channel 206 can reduce (e.g., mitigate) the possibility of the clamping apparatus 300 becoming unsecured from the rail 104.

Figure 9:
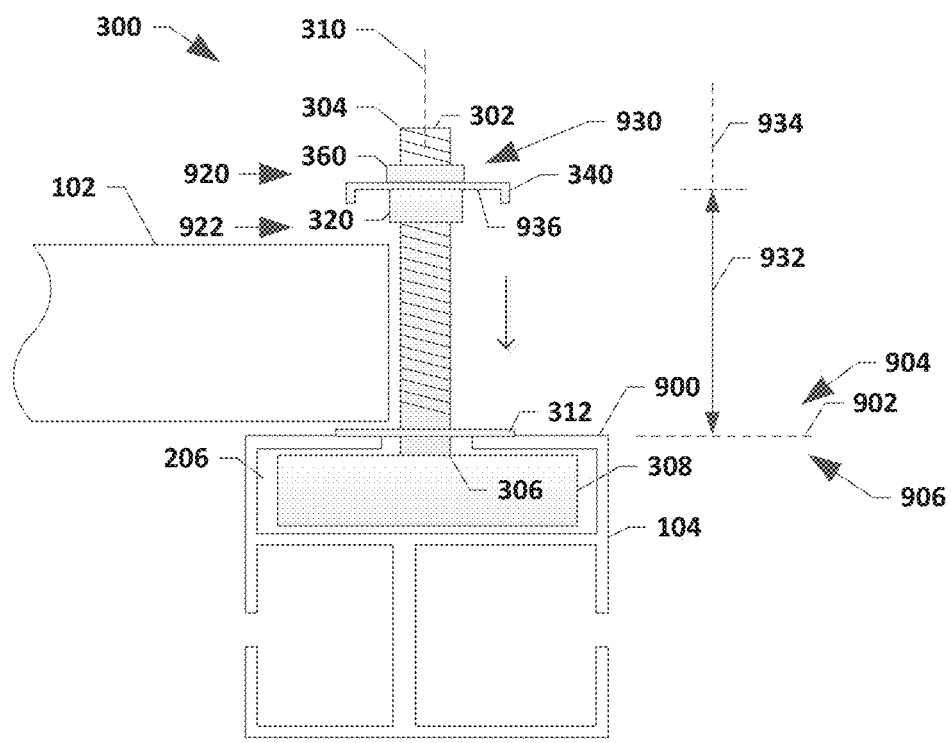
FIG. 9 illustrates a clamping apparatus in association with an example photovoltaic module.

FIG. 9 illustrates an example photovoltaic module 102 positioned adjacent the clamping apparatus 300. In an example, the rail 104 comprises a top surface 900. The top surface 900 can support and/or be positioned adjacent to a bottom surface of the photovoltaic module 102. In some examples, the top surface 900 of the rail 104 is substantially flat/planar, while in other examples, the top surface 900 has one or more bends, curves, undulations, protrusions, recesses, channels, etc. In an example, the top surface 900 lies within a top rail surface plane 902. The top rail surface plane 902 defines a first side 904 and a second side 906. The clamp 340 and the photovoltaic module 102 are disposed on the first side 904 of the top rail surface plane 902. The head 308 and the channel 206 are disposed on the second side 906 of the top rail surface plane 902.

The support structure 320 is disposed between the clamp 340 on a first side 920 of the support structure 320 and the top rail surface plane 902 on a second side 922 of the support structure 320. In the illustrated example, the first side 920 of the support structure 320 may be in contact with and/or adjacent to the clamp 340. In this example, the second side 922 of the support structure 320 may be spaced a distance apart from the top surface 900 of the rail 104. In such an example, the second side 922 of the support structure 320 may not contact and/or engage the rail 104, but, rather, may be supported the distance apart from the rail 104 by the bolt 302 (e.g., by receiving the bolt 302 therethrough).

The support structure 320 can position the clamp 340 at a first location 930 on the bolt 302 when the second end 306 of the bolt 302 is received within the rail 104 and the clamp 340 does not secure the one or more photovoltaic modules 102 to the rail. Indeed, in this example, the clamp 340 may be initially spaced a distance apart (e.g., above) the photovoltaic module 102. As such, when the support structure 320 positions the clamp at the first location 930, the photovoltaic module 102 can be moved with respect to the clamp 340, such that the photovoltaic module 102 can be oriented/positioned as desired. It will be appreciated that the first location 930 illustrated in FIG. 9 is not intended to be limiting. Rather, in other examples, the first location 930 can be located higher or lower along the bolt 302 than as illustrated. In these examples, the first location 930 represents a position in which the clamp 340 may not interfere with, contact, and/or secure the photovoltaic module 102, such that the photovoltaic module 102 can be oriented/positioned as desired.

In the illustrated example, the first location 930 may be located a first distance 932 from the top rail surface plane 902 within which the top surface 900 of the rail 104 lies. In this example, the first distance 932 extends along a first distance axis 934 that is substantially parallel to the bolt axis 310. The first distance 932 may be measured from the top rail surface plane 902 to a bottom surface 936 of the clamp 340. In the illustrated example, the clamp 340 is disposed on the first side 920 of the top rail surface plane 902 when the clamp 340 is positioned at the first location 930. The second end 306 of the bolt 302 is disposed to the second side 922 of the top rail surface plane 902 when the second end 306 of the bolt 302 is received within the rail 104.

Figure 10:
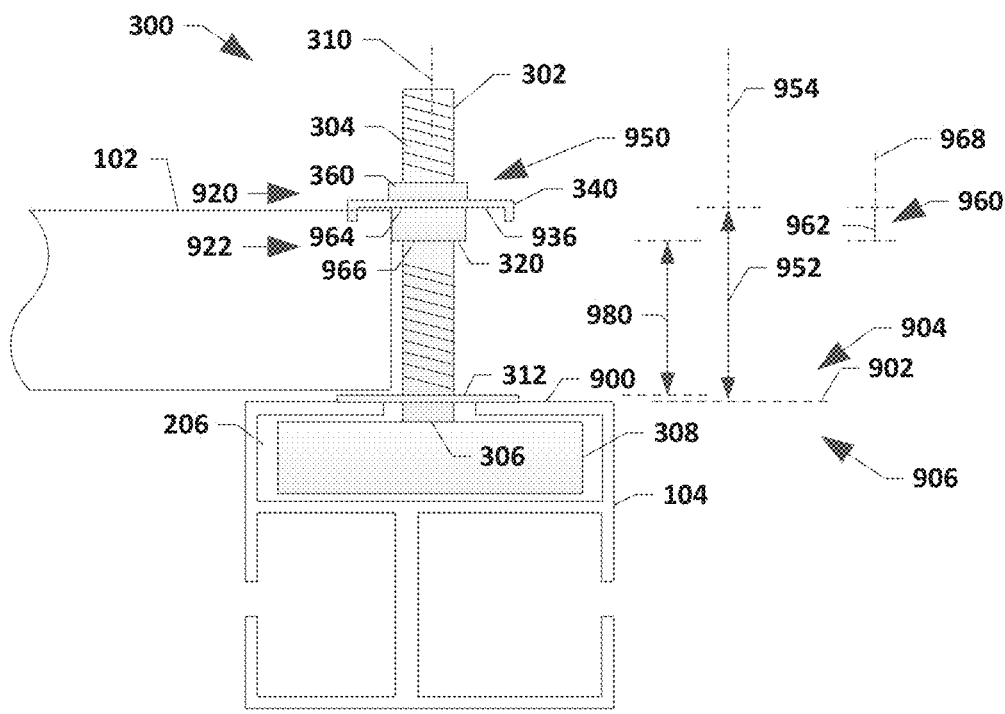
FIG. 10 illustrates a clamping apparatus in association with an example photovoltaic module.

Turning to FIG. 10, the support structure 320 can position the clamp 340 at a second location 950 on the bolt 302 when the second end 306 of the bolt 302 is received within the rail 104 and the clamp 340 does secure the one or more photovoltaic modules 102 to the rail. In this example, the nut 360 can be tightened onto the bolt 302, thus causing the nut 360 to move in a downward direction with respect to the bolt 302 towards the second end 306 of the bolt 302 and the head 308. As the nut 360 is tightened, the clamp 340 (and, thus, the support structure 320) is moved from the first location 930 (e.g., illustrated in FIG. 9) on the bolt 302 downwardly towards the second location 950 on the bolt 302. The nut 360 can be tightened at least until the clamp 340 contacts/engages the photovoltaic module 102. Once the clamp 340 contacts/engages the photovoltaic module 102, the photovoltaic module 102 is secured and is limited from being inadvertently removed from the clamping apparatus 300 and the rail 104.

In the illustrated example, the second location 950 may be located a second distance 952 from the top rail surface plane 902 within which the top surface 900 of the rail 104 lies. In this example, the second distance 952 extends along a second distance axis 954 that is substantially parallel to the bolt axis 310. The second distance 952 may be measured from the top rail surface plane 902 to the bottom surface 936 of the clamp 340. In such an example, the clamp 340 is disposed to the first side 920 of the top rail surface plane 902 when the clamp 340 is positioned at the second location 950, the first distance 932 is different than the second distance 952. In the illustrated examples, the first distance 932 is greater than the second distance 952.

The support structure 320 has a support structure thickness 960 corresponding to a third distance 962. The third distance 962 is measured axially from a first end 964 (e.g., top end) of the support structure to a second end 966 (e.g., bottom end) of the support structure 320. In an example, the third distance 962 extends along a support structure axis 968 that is substantially parallel to the bolt axis 310. The third distance 962 may be less than the first distance 932 and less than the second distance 952. In an example, the third distance 962 may be less than about one half (½) of the second distance 952. In another example, the third distance 962 may be less than about one quarter (¼) of the second distance 952.

Having the third distance 962 (e.g., corresponding to an axial length of the support structure 320) be less than the second distance 952 is beneficial in a number of ways. First, the support structure 320 has a relatively short axial length (e.g., between the first end 964 and the second end 966), thus reducing the cost of the support structure 320 (e.g., less material). Second, the support structure 320 can be positioned at a relatively large number of locations along the bolt 302, such that the clamp 340 can be supported (e.g., by the support structure 320) at a wide range of locations along the bolt 302.

In the illustrated example, the second end 966 of the support structure 320 is separated a fourth distance 980 from the grounding device 312. The support structure thickness 960 corresponding to the third distance 962 is less than the fourth distance 980. As such, a gap, space, etc. exists between the second end 966 of the support structure 320 and the grounding device 312 and the second end 306 of the bolt 302.

Figure 11:
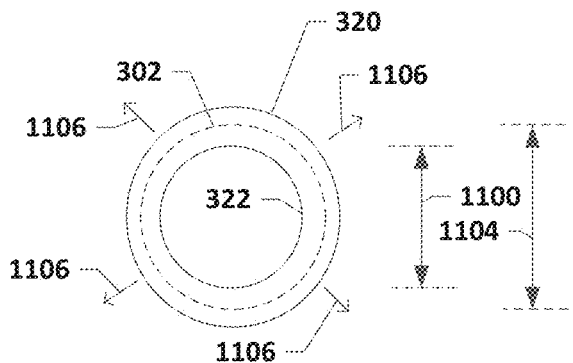
FIG. 11 illustrates an example support structure.
Figure 12:
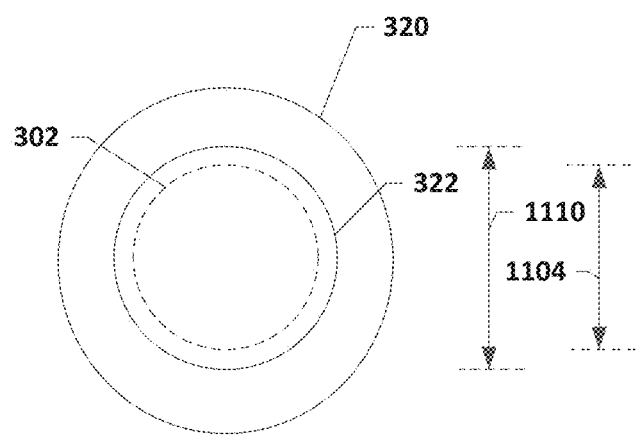
FIG. 12 illustrates an example support structure.

Turning to FIGS. 11 and 12, a top down view of the support structure 320 and the bolt 302 is illustrated. In an example, the support structure 320 comprises an expandable/compressible material, such as a gasket, for example. The support structure 320 defines the second bolt opening 322 into which the bolt 302 is received. Due to being comprised of an expandable/compressible material, the support structure 320, and, thus, the second bolt opening 322, is expandable between an unexpanded stated (e.g., illustrated in FIG. 11) and an expanded state (e.g., illustrated in FIG. 12).

As illustrated in FIG. 11, the second bolt opening 322 defines a first cross-sectional size 1100 in the unexpanded state. In this example, the bolt 302 defines a third cross-sectional size 1104. In the unexpanded state, the second bolt opening 322, defining the first cross-sectional size 1100, is smaller than the bolt 302. That is, the first cross-sectional size 1100 of the second bolt opening 322 in the unexpanded state is less than the third cross-sectional size 1104 of the bolt 302. As such, when the support structure 320 is in the unexpanded state, the bolt 302 may not fit into the second bolt opening 322.

Turning to FIG. 12, the support structure 320 can be expanded 1106 from the unexpanded state (e.g., illustrated in FIG. 11) to an expanded state (e.g., illustrated in FIG. 12). The expansion 1106 of the support structure 320 is illustrated schematically in FIG. 11 (e.g., with arrowheads), as the expansion 1106 can occur in any number of ways. For example, the support structure 320 can be expanded 1106 by a pulling force, such as by a user/operator pulling the support structure 320 radially outwardly.

After the expansion 1106, the second bolt opening 322 of the support structure 320 defines a second cross-sectional size 1110 in the expanded state. In this example, the first cross-sectional size 110 of the support structure 320 in the unexpanded state is less than the second cross-sectional size 1110 of the support structure 320 in the expanded state. In an example, the second cross-sectional size 1110 is larger/greater than the third cross-sectional size 1104 of the bolt 302. Accordingly, as illustrated in FIG. 12, the bolt 302 can fit within and be received within the second bolt opening 322 when the second bolt opening 322 of the support structure 320 is in the expanded state. As such, the third cross-sectional size 1104 of the bolt 302 is larger than the first cross-sectional size 1100 and less than the second cross-sectional size 1110.

The support structure 320 can therefore be compressed/expanded between the unexpanded state (e.g., illustrated in FIG. 11) and the expanded state (e.g., illustrated in FIG. 12). When the support structure 320 is expended to the expanded state, the second bolt opening 322 is sized to receive the bolt 302. As such, the bolt 302 can be received within and passed through the second bolt opening 322, such that the support structure 320 can be moved/adjusted along the bolt 302. When the pulling/expanding force (e.g., expansion 1106) is no longer provided to the support structure 320, the support structure 320 can revert back towards the unexpanded state. However, after the bolt 302 is received through the second bolt opening 322, the support structure 320 can radially compress onto the bolt 302 (e.g., as illustrated in FIGS. 9 and 10). When the support structure 320 has compressed onto the bolt 302, the support structure 320 can radially surround and compress onto the bolt 302, such that the support structure 320 contacts/engages and "grips" the bolt 302.

When the support structure 320 radially compresses onto the bolt (e.g., contacts/engages, grips, etc.), the support structure 320 is limited from inadvertently moving (e.g., axially up/down, radially, etc.) with respect to the bolt 302. Rather, for the support structure 320 to move (e.g., axially up/down, radially, etc.) with respect to the bolt 302, a sufficient force can be applied, with the force being greater than the compressive force exerted by the support structure 320 onto the bolt 302. In an example, this force could be applied by pushing/pulling the support structure 320 axially up/down the bolt 302. In another example, this force could by applied by pushing/pulling the clamp 340 axially up/down the bolt 302 such that the clamp 340 acts upon the support structure 320 and causes the support structure 320 to move axially up/down the bolt 302. In yet another example, this force could be applied by rotating the nut 360 with respect to the bolt 302, causing the nut 360 to drive the clamp 340 axially downwardly, which thus causes the support structure 320 to move axially up/down the bolt 302. Accordingly, due to the expansion/contraction of the support structure 320, the support structure 320 can maintain a relative position with respect to the bolt 302 at least until it is desired to move the support structure 320 (e.g., as illustrated from FIG. 9 to FIG. 10, and/or as illustrated from FIG. 14 to FIG. 16, and/or as illustrated from FIG. 17 to FIG. 19).

Figure 13:
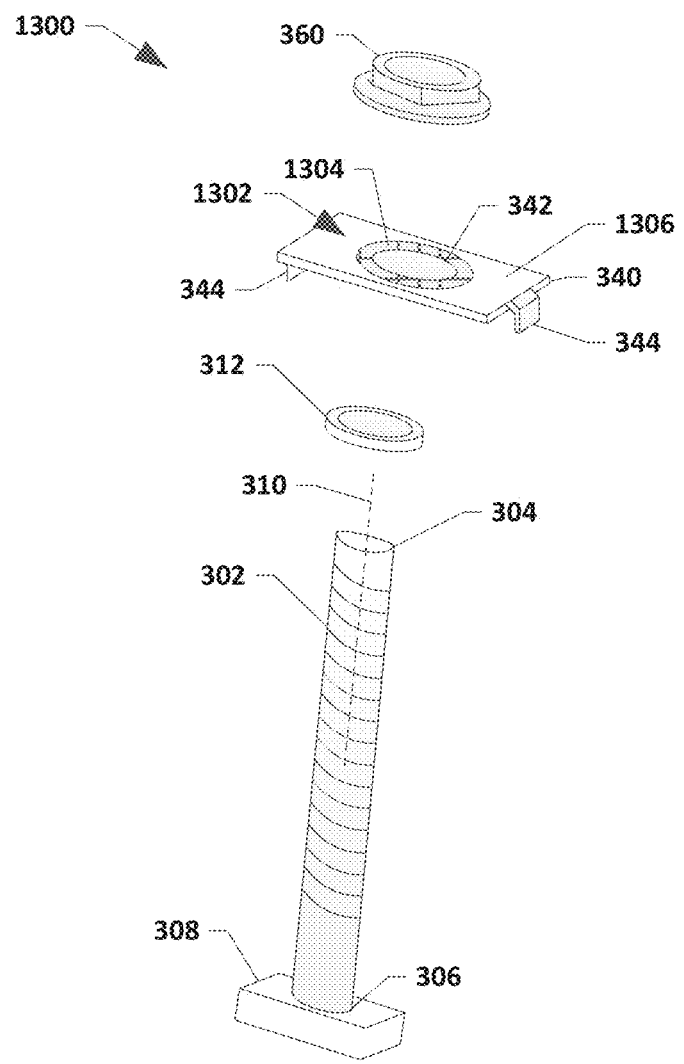
FIG. 13 illustrates an example clamping apparatus.

Turning to FIG. 13, a second example clamping apparatus 1300 is illustrated. In this example, the second clamping apparatus 1300 comprises a second example support structure 1302. The support structure 1302 comprises a first affixation 1304 that can affix the clamp 340 to the nut 360 when the second end 306 of the bolt 302 is received within the rail 104 and the clamp 340 does not secure the one or more photovoltaic modules 102 to the rail 104. The first affixation 1304 comprises any number of materials. In some examples, the first affixation 1304 comprises an adhesive (e.g., glue, paste, cement, tape, etc.), a temporary weld (e.g., tack weld, etc.), a magnet, or other temporary fixation structure.

In this example, the first affixation 1304 is illustrated as being disposed on a top surface 1306 of the clamp 340 around the bolt opening 342. Such a position is not intended to be limiting, however. Rather, in other examples, the first affixation 1304 could be disposed on the nut 360 (e.g., bottom surface of the nut 360) instead of the top surface 1306 of the clamp 340. In still other examples, the first affixation 1304 could be disposed on both of the top surface 1306 of the clamp 340 and the nut 360. In these examples, the first affixation 1304 may be disposed between the nut 360 and the clamp 340, such that the first affixation 1304 can affix the clamp 340 to the nut 360.

Figure 14:
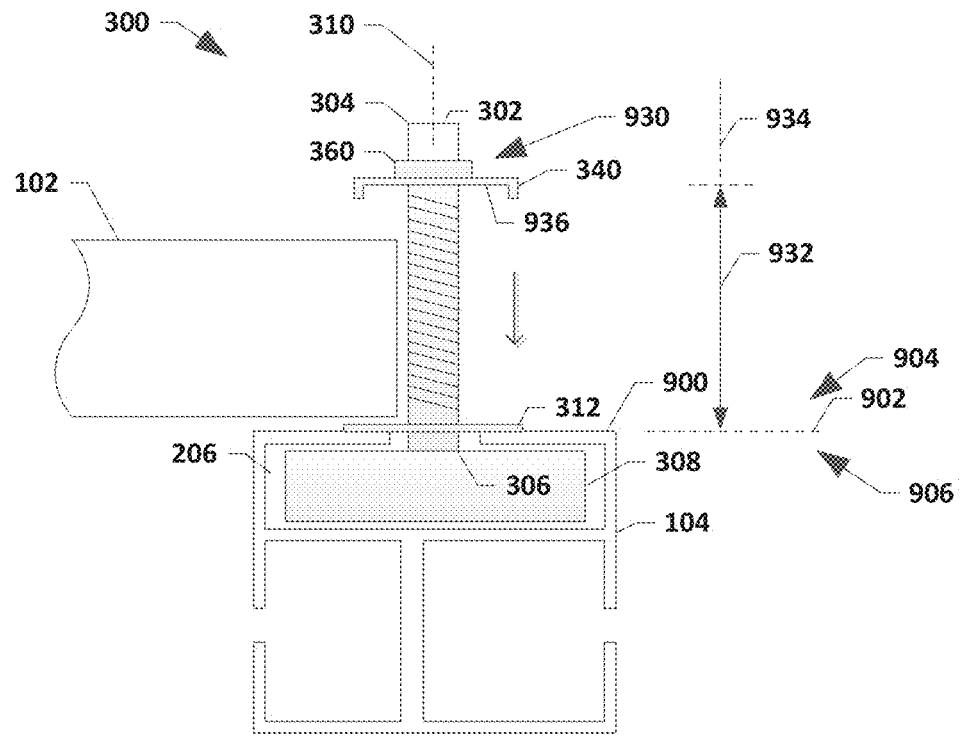
FIG. 14 illustrates a clamping apparatus in association with an example photovoltaic module.

Turning to FIG. 14, an example operation of the second clamping apparatus 1300 is illustrated. In this example, the support structure 1302 (e.g., the first affixation 1304) can initially position the clamp 340 at the first location 930 on the bolt 302. Due to the first affixation 1304 being positioned between and in contact with the clamp 340 and the nut 360, the clamp 340 and the nut 360 are initially temporarily fixed to each other. With the clamp 340 fixed to the nut 360, the clamp 340 is limited from moving towards the second end 306 of the bolt 302 when the nut 360 does not move towards the second end 306. That is, when the clamp 340 and the nut 360 are initially fixed to each other with the first affixation

1304, the clamp 340 does not move independently of the nut 360, such that the clamp 340 remains at the first location 930.

Figure 15:
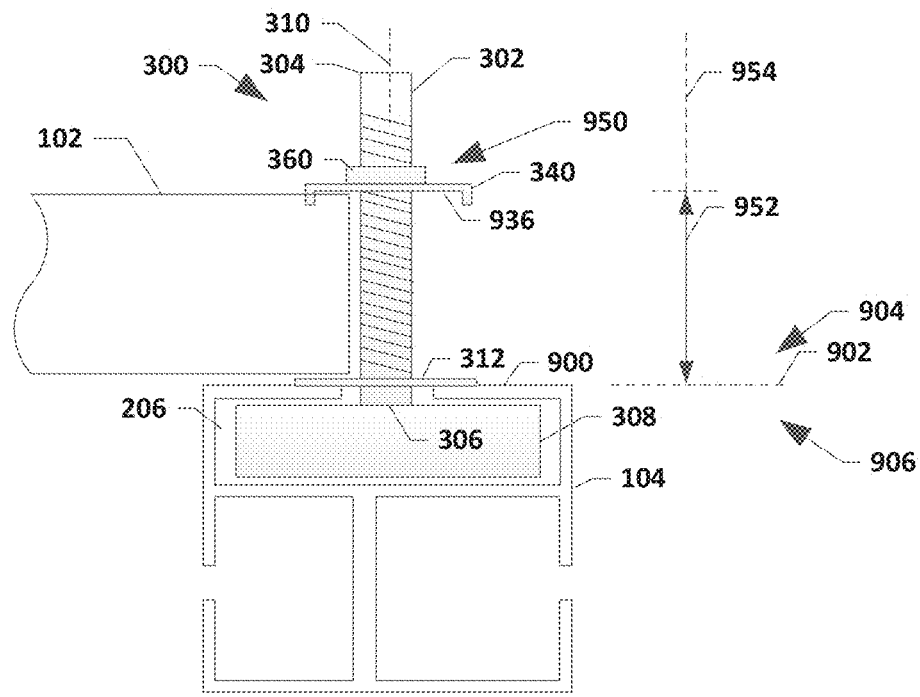
FIG. 15 illustrates a clamping apparatus in association with an example photovoltaic module.

Turning to FIG. 15, the nut 360 can be rotated, thus causing the clamp 340 and the nut 360 to detach from each other. For example, as illustrated in FIGS. 4 and 5, the bolt opening 342 has a generally matching shape as the bolt 302. As such, the clamp 340 is limited from rotating with respect to the bolt 302. Instead, movement of the clamp 340 with respect to the bolt 302 is substantially limited to the axial (e.g., up and down) direction, with limited to no rotational movement of the clamp 340 with respect to the bolt 302. As such, when the nut 360 engages the threads of the bolt 302, the nut 360 can be rotated with respect to the bolt 302. Due to the nut 360 and the clamp 340 being fixed with the first affixation 1304, rotation of the nut 360 can cause the first affixation 1304 to fracture/break. More particularly, since the clamp 340 is limited from rotating with respect to the bolt 302, when the nut 360 is rotated with respect to the bolt 302, the attachment between the nut 360 and the clamp 340 (e.g., the first affixation 1304) is broken, such that the nut 360 is no longer attached/affixed to the clamp 340. Accordingly, the nut 360 can threadingly engage the bolt 302 by being rotated such that the nut 360 moves axially downwardly with respect to the bolt 302 towards the second end 306 of the bolt 302. The clamp 340, now no longer affixed to the nut 360, can move downwardly (while not rotating) with respect to the bolt 302 towards the second end 306.

The nut 360 can continue to be rotated at least until the clamp 340 is at the second location 950 on the bolt 302 when the second end 306 of the bolt 302 is received within the rail 104 and the clamp 340 does secure the one or more photovoltaic modules 102 to the rail. The nut 360 can be tightened onto the bolt 302, thus causing the clamp 340 to move from the first location 930 (e.g., illustrated in FIG. 14) downwardly towards the second location 950 on the bolt 302. The nut 360 can be tightened at least until the clamp 340 contacts/engages the photovoltaic module 102. Once the clamp 340 contacts/engages the photovoltaic module 102, the photovoltaic module 102 is secured and is limited from being inadvertently removed from the clamping apparatus 300 and the rail 104.

Figure 16:
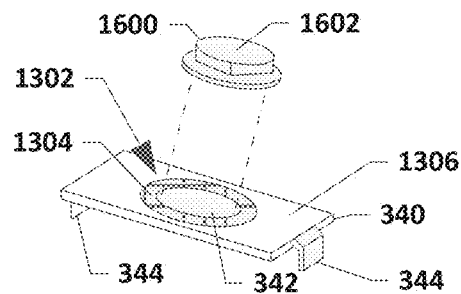
FIG. 16 illustrates an example nut in association with an example clamp.

Turning to FIG. 16, a second example nut 1600 is illustrated. The nut 1600 can be affixed to the clamp 340 with the first affixation 1304. In addition to the first affixation 1304, the support structure 1302 comprises a second affixation 1602 that affixes the nut 1600 to a location on the bolt 302 to position the clamp 340 at the first location 930. The second affixation 1602 comprises a wall, cover, surface, ceiling, adhesive (e.g., glue, tape, etc.), or any similar structure that covers an opening in the nut 1600 through which the bolt 302 is received and, at least temporarily, restricts passage of the bolt 302 through the nut 1600 at least until a sufficient force between the bolt 302 and the nut 1600 causes rupture of the second affixation 1602.

Figure 17:
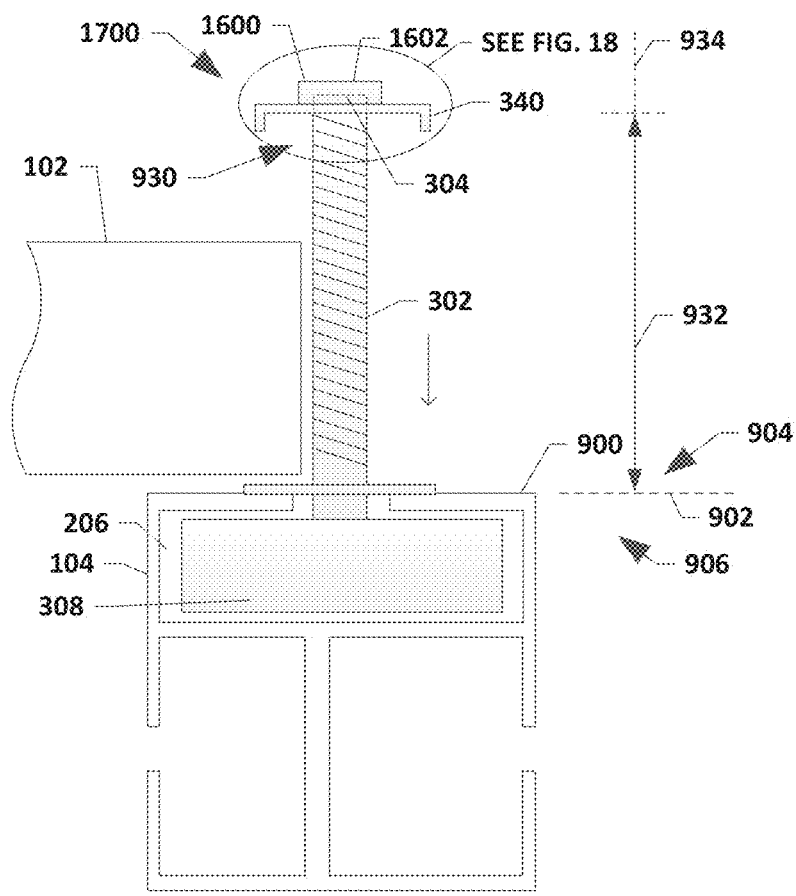
FIG. 17 illustrates a clamping apparatus in association with an example photovoltaic module.
Figure 18:
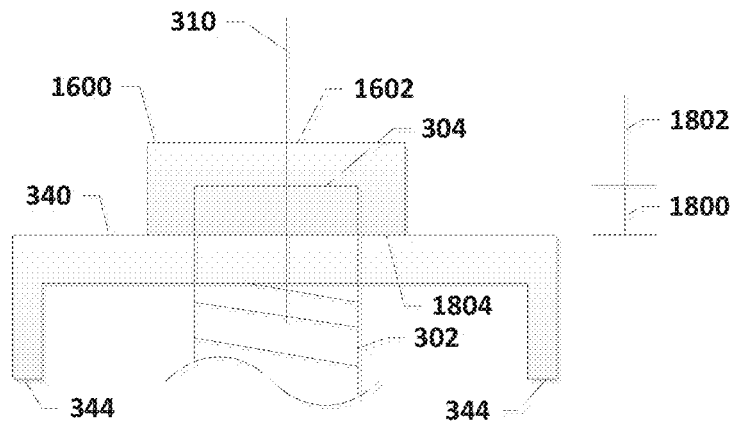
FIG. 18 illustrates an end of an example clamping apparatus.

Turning to FIGS. 17 and 18, a third clamping apparatus 1700 is illustrated. The third clamping apparatus 1700 comprises the nut 1600 affixed to the clamp 340. In an example, when the nut 1600 is received onto the bolt 302, the first end 304 of the bolt 302 contacts/abuts the second affixation 1602. The second affixation 1602 comprises a feature (e.g., wall, cover, surface, ceiling, adhesive, glue, tape, etc.) that, when in a first state (e.g., as illustrated in FIG. 17), restricts the nut 1600 from being threaded onto the bolt 302 past a first threaded distance 1800 (e.g., as illustrated in FIG. 18). The first threaded distance 1800 extends along a first threaded distance axis 1802 that is substantially parallel to the bolt axis 310 and is measured from a surface 1804 (e.g., a bottom surface) of the nut 1600 to the first end 304 of the bolt 302. In such an example, the nut 1600 is limited from being further rotated onto the bolt 302 such that the nut 1600 is limited from moving downwardly. As such, in this first state, the support structure 1302 can position the clamp 340 at the first location 930 on the bolt 302.

Figure 19:
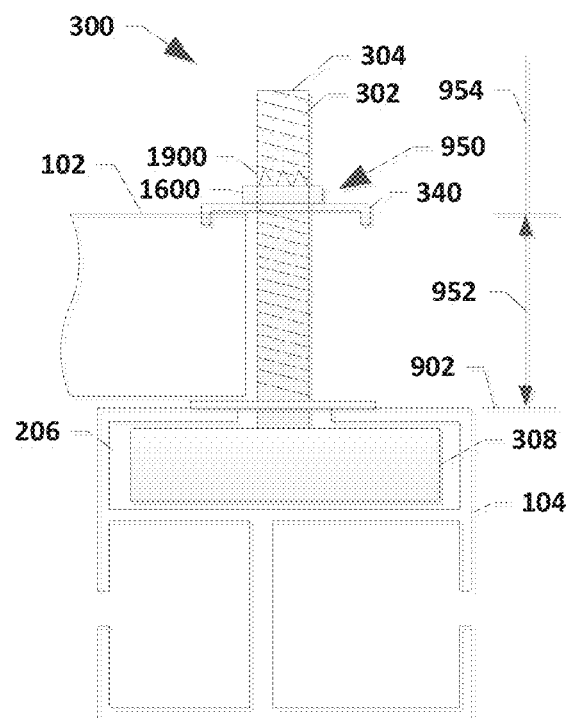
FIG. 19 illustrates a clamping apparatus in association with an example photovoltaic module.

Turning to FIG. 19, in a second state, the second affixation 1602 does not restrict the nut 1600 from being threaded onto the bolt 302 past the first threaded distance 1800. In this example, the nut 1600 can be rotated from the first state (e.g., as illustrated in FIG. 17) to the second state. Rotation of the nut 1600 causes a force to be applied onto the second affixation 1602 by the first end 304 of the bolt 302. In particular, the nut 1600 is rotated with a sufficient amount of rotational force to cause the nut 1600 to move downwardly along the bolt 302. As the nut 1600 moves downwardly, the first end 304 can push through the second affixation 1602, causing the second affixation 1602 to rupture 1900.

Once the second affixation 1602 is ruptured, the nut 1600 can continue to be rotated at least until the clamp 340 is at the second location 950 on the bolt 302 when the second end 306 of the bolt 302 is received within the rail 104 and the clamp 340 does secure the one or more photovoltaic modules 102 to the rail. The nut 1600 can be tightened onto the bolt 302, thus causing the clamp 340 to move from the first location 930 (e.g., illustrated in FIG. 17) downwardly towards the second location 950 on the bolt 302. The nut 1600 can be tightened at least until the clamp 340 contacts/engages the photovoltaic module 102. Once the clamp 340 contacts/engages the photovoltaic module 102, the photovoltaic module 102 is secured and is limited from being inadvertently removed from the clamping apparatus 300 and the rail 104.

Figure 20:
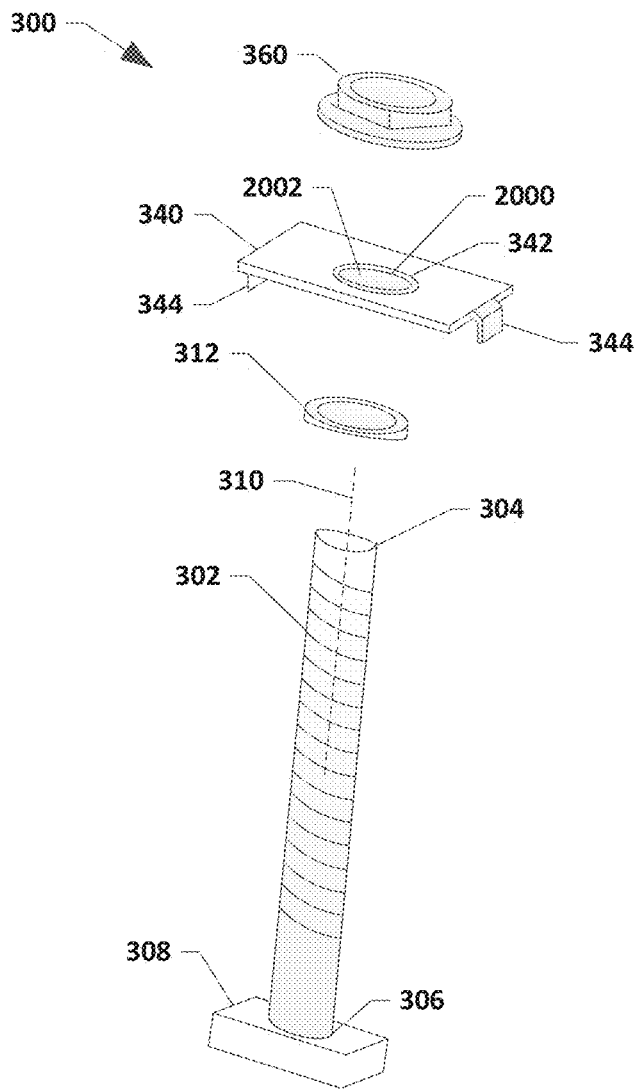
FIG. 20 illustrates an example clamping apparatus.

Turning to FIG. 20, another example of the clamping apparatus 300 is illustrated. The clamping apparatus 300 can include the bolt 302, the grounding device 312, the clamp 340, and the nut 360. In this example, the clamping apparatus 300 includes a support structure 2000. In contrast to the previous examples in which a support structure was disposed below the clamp 340 (e.g., as illustrated in FIGS. 9 and 10) or above the clamp 340 (e.g., as illustrated in FIG. 13), in this example, the support structure 2000 can be disposed at least partially within the clamp 340.

The support structure 2000 can be positioned within the bolt opening 342 of the clamp 340. The support structure 2000 has a cross-sectional size that is less than a cross-sectional size of the bolt opening 342, such that the support structure 2000 is received within the bolt opening 342. In the example of FIG. 20, the support structure 2000 is positioned within the bolt opening 342 of clamp 340 prior to the support structure 2000 and/or the clamp 340 being attached to the bolt 302. In other examples, the support structure 2000 can first be attached to the bolt 302, such as by receiving the bolt 302 through a second bolt opening 2002. Once the support structure 2000 is attached to the bolt 302, the clamp 340 can then be inserted over and/or surrounding the support structure 2000. In operation, the clamp 340 can be supported at a location (e.g., the first location 930, the second location 950, etc.) axially along the bolt 302 due to the support structure 2000 being disposed radially between the bolt 302 and the clamp 340.

Figure 21:
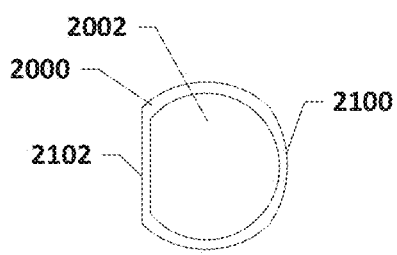
FIG. 21 illustrates an example clamping apparatus.

Turning to FIG. 21, a top down view of an example of the support structure 2000 is illustrated. In this example, the support structure 2000 defines the second bolt opening 2002. In an example, the support structure 2000 has a cross-sectional shape that substantially matches a cross-sectional shape of the bolt 302 and/or a cross-sectional shape of the bolt opening 342 of the clamp 340. For example, the support structure 2000 comprises a non-linear portion 2100 and a linear portion 2102. In this example, the non-linear portion 2100 defines a rounded, circular shape, while the linear portion 2102 defines a straight side of the support structure 2000. The support structure 2000 is therefore hollow and comprises a wall that is shaped to have the non-linear portion 2100 and the linear portion 2102. The support structure 2000 comprises any number of materials, some of which may include the materials of the support structure 320. For example, the support structure 2000 comprises elastomeric materials, neoprene materials, or the like. In such an example, the support structure 2000 has at least some degree of compressibility/flexibility, such that the support structure 2000 can be deformed/compressed/expanded/etc. in response to one or more forces.

Figure 23:
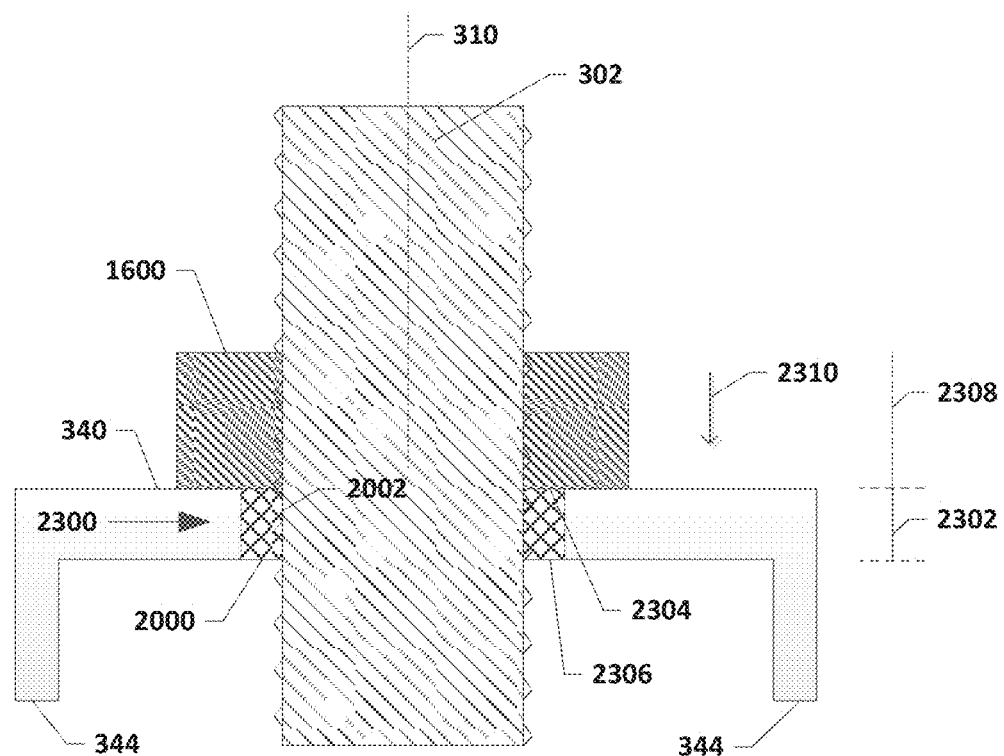
FIG. 23 illustrates an example clamping apparatus.

Turning to FIG. 23, a top down view of the support structure 2000 attached to the bolt 302 and received within the bolt opening 342 of the clamp 340 is illustrated. In this example, the support structure 2000 can support the clamp 340 at a location (e.g., the first location 930, the second location 950, etc.) along the bolt 302. The support structure 2000 can receive the bolt 302 within the second bolt opening 2002. With the support structure 2000 received onto the bolt 302, the clamp 340 can be inserted onto the support structure 2000. For example, the bolt opening 342 of the clamp 340 can be moved so as to receive the support structure 2000 therein. In such an example, the non-linear portion 2100 of the support structure 2000 can be aligned with non-linear portions of the bolt opening 342 and the bolt 302. Similarly, the linear portions 2102 of the support structure 2000 can be aligned with linear portions of the bolt opening 342 and the bolt 302.

The support structure 2000 can therefore be positioned between the clamp 340 and the bolt 302. In this example, the support structure 2000 is radially received between the clamp 340 and the bolt 302, with the support structure 2000 radially surrounding the bolt 302, while the clamp 340 radially surrounds the support structure 2000. That is, an outer radial side of the support structure 2000 contacts/engages the clamp 340 while an inner radial side of the support structure 2000 contacts/engages the bolt 302. The support structure 2000 can therefore contact/engage both the clamp 340 and the bolt 302. This contact/engagement between the support structure 2000 and the clamp 340 can support the clamp 340 at the desired location, with the clamp 340 being limited from moving axially up/down. Further, due to the substantially matching shape of the bolt opening 342, the support structure 2000 and the bolt 302, the clamp 340 (and, thus, the support structure 2000) can be rotatably attached (e.g., see 712) to the bolt 302 in a similar manner as described in FIGS. 7 and 8.

Figure 22:
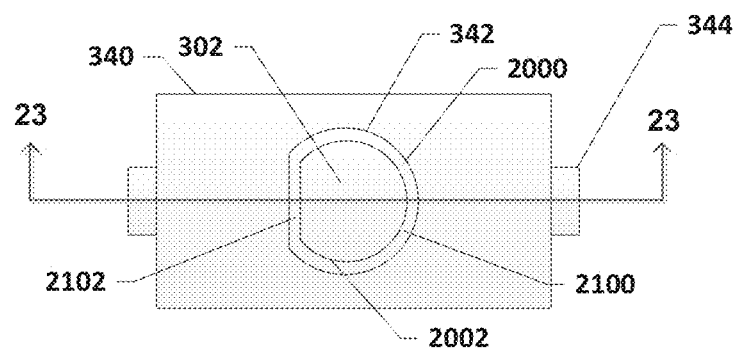
FIG. 22 illustrates an example clamping apparatus.

FIG. 23 illustrates a cross-sectional view of the support structure 2000, the clamp 340, and the bolt 302 taken along lines 23-23 in FIG. 22. As illustrated, the support structure can support the clamp 340 at a location along the bolt 302. The support structure 2000 may have a support structure thickness 2300 that corresponds to a third distance 2302 measured from a first end 2304 of the support structure 2000 to a second end 2306 of the support structure 2000. In an example, the third distance 2302 extends along a support structure axis 2308 that is substantially parallel to the bolt axis 310 and is less than the first distance 932 and the second distance 952. In this example, the third distance 2302 (e.g., the support structure thickness 2300) of the support structure 2000 is substantially equal to a clamp thickness of the clamp 340. That is, the first end 2304 of the support structure 2000 is substantially planar with respect to a top surface of the clamp 340. The second end 2306 of the support structure 2000 is substantially planar with respect to a bottom surface of the clamp 340. As such, the support structure 2000 is substantially limited from contacting the nut 360 (e.g., at the first end 2304 of the support structure 2000) and/or the photovoltaic module 102 (e.g., at the second end 2306 of the support structure 2000).

In operation, the support structure 2000 can support the clamp 340 at a location along the bolt 302. In this example, the support structure 2000 and the clamp 340 are support at a same axial location along the bolt 302. When a user/operator desires to move the clamp 340, such as to move the clamp 340 into engagement with the photovoltaic module 102, the user/operator can tighten the nut 360. Tightening of the nut 360 can cause the clamp 340 and the support structure 2000 to move along a movement direction 2310 downwardly towards the photovoltaic module 102. In such an example, the force applied by the nut 360 is at least enough to overcome a compressive force exerted by the support structure 2000 onto the bolt 302, such that tightening of the nut 360 onto the bolt 302 can cause the support structure 2000 and the clamp 340 to move in the movement direction 2310 (e.g., downwardly).

In the aforementioned examples illustrated and described with respect to FIGS. 1 to 23, the clamping apparatus (e.g., 300, 1300, 1700) may be assembled prior to coupling it to the rail and/or it may be assembled as part of the act of coupling the clamping apparatus to the rail. For example, in one embodiment, the clamping apparatus is preassembled such that the bolt, support structure, clamp, and/or the nut are coupled together (e.g., fastened together) prior to the clamping apparatus being coupled to the rail (e.g., in a factory and/or at an installation site). In this way, the clamping apparatus is one unit prior to assembly with the rail. However, in another embodiment, coupling the clamping apparatus to the rail may comprise assembling the clamping apparatus on the rail. For example, a second end of the bolt may be inserted into a channel of the rail, and the rail may be positioned/oriented as desired. Subsequently, the support structure may be associated with the bolt, a clamp may be placed onto the bolt via a bolt opening of the clamp, and a nut may be secured to the bolt to hold the support structure and clamp in place.

Typically, the support structure is configured to maintain a relative orientation of the clamping apparatus and the rail (e.g., such that angle between the clamping apparatus and a top edge of the rail is substantially ninety degrees). Moreover, in an embodiment, the support structure may be slightly compressed as part of the preassembly such that a degree of pressure is applied to the rail. Such pressure may further assist in maintaining a position of the clamping apparatus relative to the rail (e.g., such that the clamping apparatus does not slide along the channel). Thus, the support structure may be utilized to reduce slippage of the clamping apparatus when (an edge of) a module is positioned between the rail and the clamp of the clamping apparatus, for example.

As described above, in some embodiments, the clamp and/or the bolt may comprise features that further aid in the installation of the photovoltaic modules and/or in securing the photovoltaic module(s) to the rail. For example, in one embodiment, the bolt may comprise a shaft having a non-cylindrical portion and the clamp may comprise a corresponding (e.g., similarly shaped), non-cylindrical opening through which the non-cylindrical portion of the bolt can be inserted. In this way, rotation of the bolt relative to the clamp is reduced (e.g., to reduce the possibility of the bolt being turned in such a manner that it can slip and/or rotate out of the channel). Moreover, the clamp may comprise tabs that abut a side-edge of the photovoltaic modules to further reduce the possibility of the clamp rotating.

Once the rail is preassembled at (e.g., which includes coupling the clamping apparatus to the rail), the preassembled rail may be shipped for assembly. In this way, the rail may be shipped from the factory with the clamping apparatuses preinstalled at specified locations to reduce installation time on site, for example. To complete the installation onsite, the installer therefore merely attaches the rails to an installation site (e.g., a roof) inserts one or more modules into the space between the top edge of the rail and the clamp (e.g., as established by the support structure), secures the module by tightening a nut of the respective clamping apparatuses (e.g., already installed on the rail), and connects wiring of photovoltaic module(s) to a power grid and/or power consumption device, for example.

It may be appreciated that the words "example" and/or "exemplary" are used herein to mean serving as an example, instance, or illustration. Any aspect, design, etc. described herein as "example" and/or "exemplary" is not necessarily to be construed as advantageous over other aspects, designs, etc. Rather, use of these terms is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, at least one of A and B or the like generally means A or B or both A and B.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. Similarly, illustrated ordering(s) of acts is not meant to be limiting, such that different orderings comprising the same of different (e.g., numbers) of acts are intended to fall within the scope of the instant disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A clamping apparatus configured to secure one or more photovoltaic modules to a rail, the clamping apparatus comprising:

a bolt extending along a bolt axis between a first end of the bolt and a second end of the bolt, wherein the second end of the bolt is configured to be received within the rail;

a clamp defining a bolt opening into which the bolt is received, the clamp defining a top surface and a bottom surface;

a nut configured to be threaded onto the bolt;

a support structure comprising a deformable elastomeric material, the support structure configured to:

position the clamp at a first location on the bolt when the second end of the bolt is received within the rail and the clamp does not secure the one or more photovoltaic modules to the rail, the first location a first distance from a top rail surface plane within which a top surface of the rail lies wherein the first distance extends along a first distance axis that is parallel to the bolt axis and is measured from the top rail surface plane to the bottom surface of the clamp, and wherein the clamp is disposed to a first side of the top rail surface plane when the clamp is positioned at the first location and the second end of the bolt is disposed to a second side of the top rail surface plane when the second end of the bolt is received within the rail, and position the clamp at a second location on the bolt when the second end of the bolt is received within the rail and the clamp does secure the one or more photovoltaic modules to the rail, the second location a second distance from the top rail surface plane wherein the second distance extends along a second distance axis that is parallel to the bolt axis and is measured from the top rail surface plane to the bottom surface of the clamp, and wherein the clamp is disposed to the first side of the top rail surface plane when the clamp is positioned at the second location, the first distance different than the second distance, wherein the support structure has a support structure thickness corresponding to a third distance measured from a first end of the support structure to a second end of the support structure, wherein the third distance extends along a support structure axis that is parallel to the bolt axis and is less than the first distance and less than the second distance; and when the clamp is positioned at the first location and when the clamp is positioned at the second location:

the nut is disposed on the top surface of the clamp and is disposed on a top side of a top surface plane along which a top surface of the one or more photovoltaic modules extends, and the support structure is disposed on the bottom surface of the clamp; and a grounding device configured to electrically ground the bolt, the grounding device disposed between the second end of the support structure and the top rail surface plane, wherein the second end of the support structure is a fourth distance from the grounding device, and wherein the support structure thickness corresponding to the third distance is less than the fourth distance.

2. The clamping apparatus of claim 1, wherein the support structure defines a second bolt opening into which the bolt is received.

3. The clamping apparatus of claim 2, wherein a sidewall of the support structure defining the second bolt opening is non-threaded.

4. The clamping apparatus of claim 2, wherein the second bolt opening of the support structure is expandable between an unexpanded state and an expanded state.

5. The clamping apparatus of claim 4, wherein the second bolt opening defines a first cross-sectional size in the unexpanded state and a second cross-sectional size in the expanded state.

6. The clamping apparatus of claim 5, wherein the first cross-sectional size is less than the second cross-sectional size.

7. The clamping apparatus of claim 6, wherein the bolt defines a third cross-sectional size that is larger than the first cross-sectional size and less than the second cross-sectional size.

8. The clamping apparatus of claim 7, wherein the second bolt opening of the support structure is expandable between the unexpanded state and the expanded state at a constant temperature.

9. The clamping apparatus of claim 1, wherein an outer circumference of the support structure has an infinite slope.

10. The clamping apparatus of claim 1, wherein the support structure has an outside diameter, and the outside diameter is less than a separation distance between a first photovoltaic module and a second photovoltaic module, preventing the support structure from contacting a frame of the first photovoltaic module and a frame of the second photovoltaic module.

11. A clamping apparatus configured to secure one or more photovoltaic modules to a rail, the clamping apparatus comprising:
- a bolt extending along a bolt axis between a first end of the bolt and a second end of the bolt, wherein the second end of the bolt is configured to be received within the rail;
- a clamp defining a top surface and a bottom surface and defining a bolt opening into which the bolt is received;
- a nut configured to be threaded onto the bolt;
- a support structure comprising a deformable elastomeric material, the support structure configured to:
    position the clamp at a first location on the bolt when the second end of the bolt is received within the rail and the clamp does not secure the one or more photovoltaic modules to the rail, the first location a first distance from a top rail surface plane within which a top surface of the rail lies, wherein the first distance extends along a first distance axis that is parallel to the bolt axis and is measured from the top rail surface plane to the bottom surface of the clamp, and
    position the clamp at a second location on the bolt when the second end of the bolt is received within the rail and the clamp does secure the one or more photovoltaic modules to the rail, the second location a second distance from the top rail surface plane wherein the second distance extends along a second distance axis that is parallel to the bolt axis and is measured from the top rail surface plane to the bottom surface of the clamp, the first distance different than the second distance,
- wherein the support structure has a support structure thickness corresponding to a third distance measured from a first end of the support structure to a second end of the support structure, wherein the third distance extends along a support structure axis that is parallel to the bolt axis; and
- a grounding device configured to electrically ground the bolt, the grounding device disposed between the second end of the support structure and the top rail surface plane,
- wherein the second end of the support structure is a fourth distance from the grounding device, and
- wherein the support structure thickness corresponding to the third distance is less than the fourth distance.

12. The clamping apparatus of claim 11, wherein the nut is disposed on the top surface of the clamp.

13. The clamping apparatus of claim 11, wherein the support structure is spaced apart from the top surface of the rail when the support structure positions the clamp at the first location and when the support structure positions the clamp at the second location.

14. The clamping apparatus of claim 11, wherein the support structure defines a second bolt opening into which the bolt is received.

15. The clamping apparatus of claim 14, wherein the second bolt opening of the support structure is expandable between an unexpanded state and an expanded state.

16. The clamping apparatus of claim 15, wherein the second bolt opening defines a first cross-sectional size in the unexpanded state and a second cross-sectional size in the expanded state.

17. The clamping apparatus of claim 16, wherein the first cross-sectional size is less than the second cross-sectional size.

18. The clamping apparatus of claim 17, wherein the bolt defines a third cross-sectional size that is larger than the first cross-sectional size and less than the second cross-sectional size.

19. The clamping apparatus of claim 11, wherein when the third distance is less than about one half (½) of the second distance.

* * * * *